United States Patent [19]

Lim et al.

[11] 4,047,130

[45] Sept. 6, 1977

[54] SURFACE ACOUSTIC WAVE FILTER

[75] Inventors: Teong C. Lim, Thousand Oaks, Calif.; Umit Tarakci, Balikesir, Turkey; Carmine F. Vasile, Thousand Oaks, Calif.

[73] Assignee: Rockwell International Corporation, El Segundo, Calif.

[21] Appl. No.: 718,249

[22] Filed: Aug. 27, 1976

[51] Int. Cl.² .......................... H03H 9/04; H03H 9/26; H03H 9/32; H03H 9/30
[52] U.S. Cl. ....................................... 333/72; 310/313; 310/367; 333/30 R
[58] Field of Search ........................ 333/72, 71, 30 R; 330/5.5, 53, 57; 29/25.35; 235/181; 358/36–38, 166, 184, 196; 328/167; 310/9.8, 9.1, 8, 8.1, 8.2; 331/107 A

[56] References Cited

U.S. PATENT DOCUMENTS

| 3,573,673 | 4/1971 | de Vries et al. | 333/72 |
| 3,581,248 | 5/1971 | de Vries et al. | 333/72 |
| 3,659,231 | 4/1972 | de Vries | 333/72 |
| 3,872,410 | 3/1975 | Zucker | 333/72 |
| 3,955,160 | 5/1976 | Duffy | 333/30 R |
| 3,983,515 | 9/1976 | Mitchell et al. | 333/30 R |

Primary Examiner—Alfred E. Smith
Assistant Examiner—Marvin Nussbaum
Attorney, Agent, or Firm—L. Lee Humphries; Craig O. Malin

[57] ABSTRACT

A surface acoustic wave filter has a Lithiumniobate substrate of parallelogram configuration, which is bonded to a header having similar acoustic impedance. The substrate has three transducers arranged along its long sides at particular spacings destined to suppress triple transit echoes. The short sides are oblique and surface portions adjacent thereto are covered by surface waves attenuating paddings. Two such filters are cascaded on the same header.

12 Claims, 4 Drawing Figures

SURFACE ACOUSTIC WAVE FILTER

BACKGROUND OF THE INVENTION

The present invention relates to surface wave acoustic filter devices and more particularly the invention relates to the construction of such devices particularly with regard to features being useful for incorporating the device in a band-pass amplifier system.

Without attempting to restrict usefulness of the filter device in accordance with the present invention, surface acoustic wave filters are being employed, for example, in the i.f. channel of a TV set. The requirements posed here are quite stringent, particularly with regard to off-band rejection, and surface wave devices are well-suited for meeting these requirements. Such a surface acoustic wave device includes usually a flat substrate made of a piezoelectric material and carrying on one of its surfaces two or more pairs of interdigitized combs, which are established by means of metallization fingers on the substrate surface. These pairs constitute surface wave transducers, and they are aligned (in the surface) in the direction extending transversely to the direction of extension of the fingers. At least one of these transducers acts as transmitter for surface waves, at least another one acts as receiver. The wavelength of the surface waves produced and received is determined by the fingers spacing of the transducers. This finger spacing defines particularly the center frequency of the resulting filter pass-band range.

Off-band rejection is in the first instance defined and established by a technique called apodization. Apodization of at least one of the transducers provides for a particular contour in the finger overlap. It was found that this apodization contour permits the direct generation of a particular frequency response reducing off-band lobes below a tolerable level.

It was found, however, that such a device poses a number of other problems which tend to degrade its off-band rejection properties. One of the problems originates directly from the phenomena involved and utilized. A surface wave transducer inherently produces also bulk waves, i.e. the transducer transmits shear and compression waves into the interior of the piezoelectric substrate. These bulk waves will be reflected by any physical boundary or, more generally, by a discontinuity of acoustic wave transmissivity (acoustic impedance). Such a reflected wave will reach a receiving transducer in addition to the regular surface waves; it is for this reason that the reflected bulk waves degrade the off-band rejection properties of the filter. Moreover, the bulk waves may exhibit different transit times, because the propagation speed of Rayleigh waves is different from the propagation speed of compression and shear waves. In addition, bulk waves having pass-band frequency contribute to the production of the so-called pass-band ripple.

Another problem has to do with the reflection and transmission of surface waves. First of all, surface waves are readily reflected by the edges of the substrate, resulting in a direct echo that may be received by the receiving transducer. Another problem has to do with the specific interaction of transducer electrodes with the piezoelectric substrate underneath. A surface wave transducer can act as receiver as well as transmitter, because the interaction between the transducer electrodes and the piezoelectric material is a reversible one. Thus, a receiver may well act as transmitter and will, in fact, do so upon being energized as receiver. Particularly, a transducer upon receiving and responding to an incoming surface wave generates an electrical voltage, which, in turn, stimulates acoustically the piezoelectric material for generating surface waves. These waves if generated by the transducer which is supposed to be only a receiver, travel back to the original transmitter and interact therewith in like manner, whereupon surface waves are generated thereat which will reach again the receiver. Thus, the latter actually receives another signal which can also be termed an echo.

An echo signal produced as aforedescribed is delayed as compared with the original signal by a period of time equal to one round trip between the two transducers. Each signal (as to information content) travels actually three times the distance between the transducers so that this particular echo is called the triple transit echo. The several echo signals are disturbances which may become noticeable in a two-fold manner. First of all, they contribute to the so-called pass-band ripple and in addition they have the effect of true echoes. They arrived at the receiver but delayed relative to the original signal as received; in a TV circuit the echoes may produce so-called "ghosts".

DESCRIPTION OF THE INVENTION

It is an object of the present invention to improve surface acoustic wave filter devices for alleviating the problems outlined above.

It is a specific object of the present invention to improve the construction of surface acoustic wave devices so that bulk waves are attenuated as much as possible prior to reaching the receiver or receivers of the device.

It is another specific object of the present invention to improve the construction of surface acoustic wave devices, so that the triple transit echoes and other echoes will be suppressed at least to the extend that they do not produce any ghosts nor cause any significant pass-band ripple.

In accordance with the preferred embodiment of the present invention, it is suggested to provide a thin, parallelogram-shaped piezoelectric substrate carrying on one surface groups or pairs of interdigitized metallization fingers which establish at least one transducer for transmitting acoustic surface waves and at least one transducer for receiving such waves propagating in direction along the long sides of the parallelogram. The oblique short sides of the substrate parallelogram are oriented to reflect surface waves away from the receiver; moreover, the surface area of the substrate adjacent these short sides should be covered by an elastic compound for attenuating any arriving and reflected surface waves. The transducers have an edge-to-edge spacing which is less than one half the distance a surface wave propagates during a period of time which is equal to the pulse response recovery period of an amplifier connected to the filter. The length of the parallelogram is chosen, so that the distance from the center of a transducer to the oblique short side of the parallelogram at one side of the transducer, is slightly larger than the center-to-center spacing to the transducer on the other side. The substrate is bonded to a base having at least approximately the same acoustic impedance as the substrate for compression and shear waves, the bonding layer is electrically conductive and quite thin, its thickness being uniformly less than one wavelength for such acoustic waves. Preferably, the thickness changes gradually from one end to the other corresponding to a slight tilt of the substrate. Finally, the dimensions of the piezoelectric substrate must be accurately controlled so that any plate mode resonances do not occur within the passband, or in areas requiring high offband rejection; e.g., frequencies near zeros of transmission are desired. It was found empirically that it is possible to shift zeros of transmission by varying the chip size and location of transducer patter relative to crystal edges. Therefore, in order to achieve reproducible results, fairly tight controls on geometry are required.

It was found that a filter constructed in accordance with the inventive features exhibits rather low bulk wave response as these bulk waves readily propagate into the base and very little is reflected at the interface between the base and the pezoelectric substrate. Moreover, the echo signals produced when a surface wave receiving transducer retransmits surface waves (e.g., triple transit echos) are hidden in the amplifier recovery period, and reflected surface waves, reflected by the substrate edges, are attenuated and redirected and contribute very little to receiver response.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings, in which:

Figure 1:
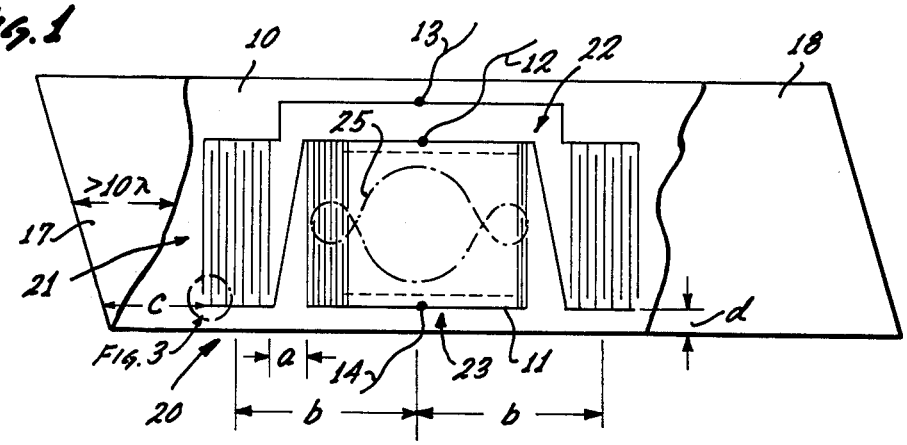
FIG. 1 is a plan view of a surface acoustic wave filter constructed in accordance with the preferred embodiment of the invention.

Proceeding now to the detailed description of the drawings, the figures show a piezoelectric substrate or wafer 10 which has an elevational contour of a parallelogram. The wafer is made of lithium niobate and is about 0.317 ± 0.003 long, 0.108 ± 0.002 wide and about 0.02 inch thick. The acute angle of the parallelogram is about 15° ± 2°.

The substrate 10 constitutes the surface acoustic wave coupler body for a filter device 20. Substrate 10 carries three transducers 21, 22, and 23, each being constructed from two interdigitized combs. These fingers extend from transverse connecting strips, such as 11, whereby three strips, one strip per transducer, are interconnected and a wire 12 being bonded thereto leads to a ground connecting pin 32 on header 30 (see FIG. 4). The respective other transverse strips of the outer transducers 21, 22 are likewise interconnected, and a wire 13 bonded to the connection is a signal input or output lead for these transducers. The second transverse strip of transducer 23 is bonded to a wire 14, which is the signal output or input lead for that transducer.

The fingers of the combs as well as the transverse connecting strip of each comb are made of metallized line elements. In most instances each finger is composed of two, parallelly running line elements 15 which are interconnected by a transverse striplet at their end, such as 16. The line elements are equidistantly spaced by a center-to-center distance equal to one quarter wavelength of the center frequency of the pass band.

The central transducer is apodized, that is to say, a gap pattern delineated by a curve 25 determines the geometry of finger overlap of the central transducer. This apodization curve, in turn, determines the pass band characteristics of the filter. The outer transducers are not apodized. The particular apodization curve has no immediate bearing on the invention, except that the curve outlines a center lobe and two side lobes, which is sufficient because the filter is preferably used in cascade circuit connection with at least one other filter.

Figure 2:
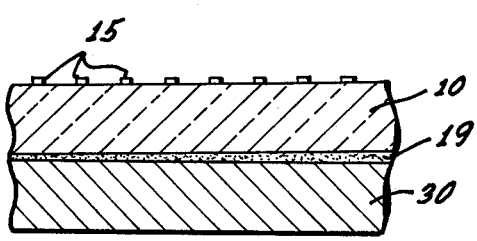
FIG. 2 is a section view of the substrate shown in FIG. 1, but on an enlarged scale.

The wafer 10 is bonded to a Kovar steel header 30 by means of a metal epoxy, e.g., a silver epoxy and with a slight tilt, which is exaggerated in FIG. 2. The tilt axis runs at right angles to the long sides of the parallelogram, so that the thickness of the bonding layer is not uniform in the direction of surface wave propagation. Howver, the bonding layer 19 has thickness below about 1 mill throughout and consistently below one wavelength, at least underneath the transducers. The short sides (edges) of the parallelogram and the top surface of the wafer adjacent thereto are covered by paddings 17 and 18 which consist of silicon rubber.

Figure 4:
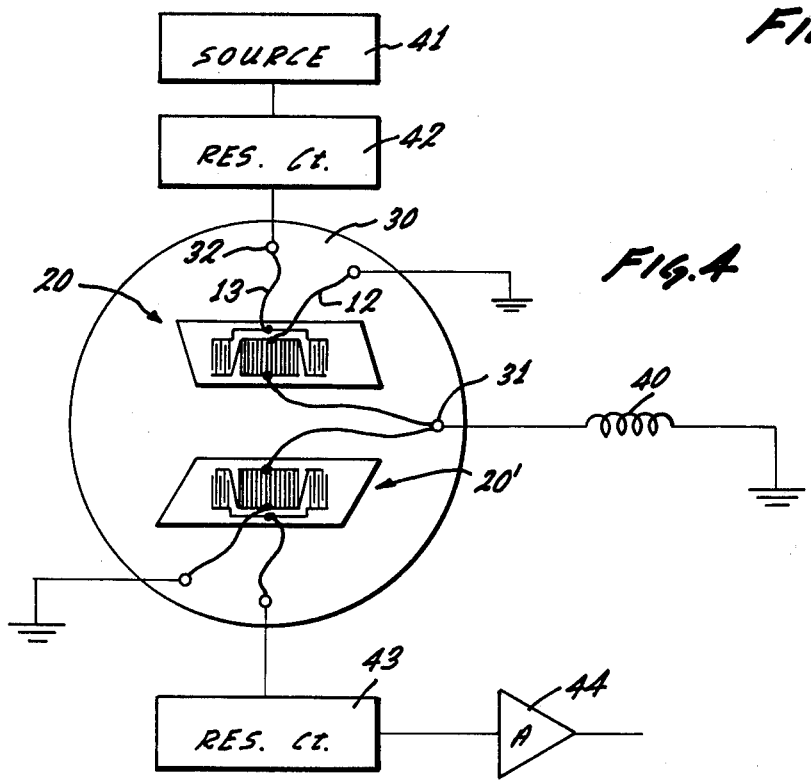
FIG. 4 is a block and circuit diagram for an i.f. filter channel in a television receiver.

Before considering further details of the filter itself, reference is made specifically to FIG. 4, showing somewhat schematically an i.f. filtering channel for television receivers. As indicated somewhat schematically, the header 30 carries two piezoelectric filters, 20 and 20', each of them being basically constructed as shown in FIG. 1, except that the finger patterns may differ slightly as explained by way of example in U.S. patent application Ser. No. 683,608, filed May 5, 1976, of one of us. The two filters 20 and 20' are cascaded in that the signal electrodes of the central transducers are electrically interconnected by being connected to a common pin 31 of header 30, which, in turn, is externally connected to ground via a coil 40 serving as coupler network for cascading two filters.

The signal electrodes of the outer transducers are interconnected for each filter, and they connect respectively to input and output circuitry. The input circuitry includes a source 41 for signals to be subjected to filtering and a connecting circuit 42, details of which are explained by way of example in the companion application Ser. No. 662,761, filed Mar. 1, 1976 of one of us. Basically, this circuit 42 includes a series resonance circuit tuned to the pass band center frequency of the two filters for short-circuiting the outer transducers of filter 20 for pass-band signals. This way, these transducers are impeded from retransmitting echo signals. The circuit 42 is specifically connected to a particular header pin 32 to which is connected the wire lead 13, leading to the signal input electrodes of the outer transducers of filter 20.

A similar tuned circuit 43 is connected to the outer transducers of filter 20' to impede the formation of echo signals therein. Reference numeral 44 refers to an output amplifier, preferably having plural stages. It is now inherent in such an amplifier 44 that it exhibits a particular pulse response recovery time, that is to say, a step signal input does not produce a step signal output, but the output of amplifier 44 assumes the steady output level with some delay, usually as an up-swing or downswing in accordance with an exponential function. In a typical i.f. channel for television this i.f. amplifier recovery time is of the order of a few microseconds.

Figure 3:
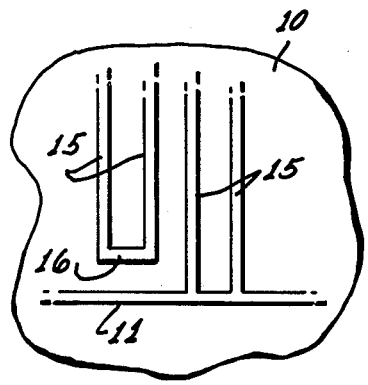
FIG. 3 is an enlarged view of a detail as indicated in FIG. 1.

After having explained the general layout of a filter device (FIGS. 1, 2 and 3) and of a specific circuit in which such a filter finds utility, we proceed to the explanation of further details as well as to the description of features and effects for obtaining the desired objectives.

The transducers, such as 21, 22 and 23, are spaced from each other, whereby two different spacings must be distinguished from each other. One spacing is the edge-to-edge distance $a$ between central transducer 23 and either of the outer transducers 21 and 22. The second spacing is given by the center-to-center distance $b$ of these transducers. For reasons below, the substrate is a little longer (long sides on the parallelogram) than four times that distance $b$.

As far as the edge-to-edge spacing is concerned, it was found that the distance $a$ must be at least as wide as the acoustic storage field of the respective transmitting transducer, because otherwise a receiving transducer would be directly stimulated by the transmitting transducer; the response of the latter transducer would interfere with the desired response to surface waves launched by the transmitting transducer. The storage field is about three to four wavelengths wide, so that distance $a$ has at least that value.

The other rule as to transducer spacings applies to the respective center-to-center spacing $b$ between the central transducer and each of the outer transducers. This center-to-center spacing determines the effective propagation time of surface waves from the transmitting to the receiving transducer. It was found that this spacing should be such that the propagation or transit time is less than one-half the pulse response-recovery delay of the amplifier 44 which has its input connected to receive the filtered pass-band. The recovery time of a typical i.f. amplifier is about 2 microseconds, hardly shorter. If one uses a Lithiumniobate substrate as surface wave propagating medium and a pass-band center frequency of about 47.5 MHz, the distance $b$ should be about twelve wavelengths. This way, the so-called triple transit echo can be "hidden" in the recovery delay. A more detailed discussion of this aspect is presented next.

Assuming that input signals are applied to transducers 21 and 22, they launch surface waves, which are picked up by the central transducer 23. However, the central transducer when electrically energized by the piezoelectric substrate underneath launches surface waves on its own, which are transmitted to the outer transducers 21 and 22. These outer transducers act also as receivers and retransmit this signal again which is received as an echo by transducer 23. Thus, each electrical signal applied to the transmitting transducers produces surface waves which are regularly received by pick-up transducer 23, producing an output but another output is produced after another round trip of echo waves between the transducers. The latter echo signal has, of course, a reduced amplitude but the loss on each reflection is not necessarily sufficient so that the echo could be neglected. However, the filter as described is designed so that the propagation time of such echo, i.e. the time for a signal to complete one round trip from the receiving transducer to the transmitting transducer(s) and back is shorter than the pulse response recovery delay of the output amplifier 44.

It can thus be seen that by holding the center-to-center distance $b$ between transmitting and receiving transducers to a value below one half of the recovery period, then the triple transit echo pulses appear still within the recovery period. This echo suppression works in addition to the particular triple transit echo suppression methods disclosed in the above-identified applications. In one instance the echo signals are attenuated, in the other instance the echo signals are summed out of phase in the cascade output. In accordance with the present feature the (residual) echo signal is hidden to occur within the recovery period of the output amplifier.

The damping substances on the substrate, paddings 17 and 18, being located between the short side edges of substrate 10 and the outer transducers, e.g. 21, 22, effectively attenuate surface waves which propagate beyond the outer transducers (when receiving — filter 20' in FIG. 4) or are actually transmitted by the outer transducers when transmitting (filter 20 in FIG. 4). The padding material should be non-corrosive (to Lithiumniobate) and elastic. Particular substances found suitable are silicone rubbers traded under the designation RTV-3144 and RTV 3140 by the Dow Corning Company. It was found that impeding short edge reflectivity of the wafer in this manner reduces pass-band ripple. It is, however, necessary that these paddings extend for at least about 10 wavelengths ($\lambda$) from the edge proper towards the closest transducer. Moreover, for a TVIF filter the spacing $c$ between the end of the outer transducer 21, and the respective closest oblique edge along the line of transmission of surface waves (which is parallel to the long sides of the parallelogram) is 0.051 $\pm$ 0.005 inches or about one sixth of the length dimension (0.311 inches) for the substrate given above. It should be mentioned that this requirement dovetails with the requirement of covering the surface adjacent to the short side edges for at least 10 wavelengths with paddings. Furthermore, dimension $d$ was found to be near optimum at about 2.5 mils for one substrate (20 in FIG. 2) and $\approx$ 12 mils for the other substrate. The dimensions $b$, $c$, and $d$ were determined empirically, other combinations may work as well and still be within the spirit of the invention; e.g., shifting spurious plate modes away from the regions of interest.

The angle $a$ between a long and short side of the parallelogram as well as the length of the wafer has been chosen so that any (specular) reflection of surface waves by that short edge clears the transducers 21, 22. Subsequent specular) reflections of surface waves on the long side edges of the waver result in waves which propagate in the direction of extension of the fingers and are, thus, not being received.

As regards the wafer thickness, it is chosen to be as thin as feasible. Lithium niobate is rather brittle and is difficult to handle. The bonding layer 19 is quite thin but not uniform. As stated, its thickness should be significantly less than one wavelength of any bulk waves that are emitted into the wafer by any of the transducers. However, the substrate 10 sits slightly tilted on the base 30. It was found that this tilt about an axis transverse to the direction of surface wave propatation improves significantly the bulk wave rejection characteristics of the filter.

The base and support element, header 30, is to have closely matched acoustic impedance, so that very little of the bulk waves is reflected. Kovar steel matches Lithiumiobate quite adequately in this regard, so that the substrate-header interface is only very little effective as a discontinuity. Moreover, due to the fact that the bonding layer has a thickness which remains uniformly below a passband wavelength for bulk waves, these bulk waves actually propagate through the thin bonding layer 19 with little reflection at either of its interfaces with the wafer 10 and the base 30. Bulk waves are thus permitted to propagate into the base 30 and will be absorbed therein. Moreover, the silver epoxy bonding layer 19 is electrically conductive and short circuits the entire lower substrate surface so that this surface as such is not capable of emitting secondary, parasitic waves.

The distance constraint on account of reducing transit time on the filter surface is, in fact, a constraint on the width of the transducers, particularly the central, apodized transducer. That width constraint causes a certain degradation in the off-band rejection by the filter. It was found, however, that cascading two such filters, each having such minimal transit times, more than offsets this degradation of off-band rejection.

The invention is not limited to the embodiments described above, but all changes and modifications thereof not constituting departures from the spirit and scope of the invention are intended to be included.

We claim:

1. A surface acoustic wave filter for use in connection with an amplifier having a particular pulse response recovery time, comprising:

a flat, piezoelectric substrate having elongated extension in one direction and a parallelogram elevational contour, there being a plurality of interdigitized fingers establishing at least two transducers respectively for transmitting and receiving acoustic surface waves propagating in the one direction, the wavelength of the passband center frequency being determined by the spacing on said interdigitized fingers, particular surface areas being free from these fingers adjacent to short side edges of the parallelogram, said edges having an angle of less than 90° relative to one direction;

a damping material covering at least a portion of the said surface areas for a width in the said direction equivalent to about ten wavelengths of the transmitted surface waves; and the edge-to-edge spacing between the transducers being greater than about four wavelengths, the center-to-center spacing between the two transducers being smaller than one half the distance a surface wave propagates during said recovery time.

2. A filter as in claim 1, wherein the spacing of the transducers from the short side edges of the substrate and the angle are selected so that any surface wave being transmitted in the direction of the long sides towards one of the short sides is being reflected out of the range of at least the transducer being closest to the one short side.

3. A filter as in claim 1 and including a support base having similar acoustic impedance as the substrate, and a bonding layer for bonding the substrate to the base, the layer having a thickness being uniformly less than one wavelength.

4. A filter as in claim 3, said substrate being slightly tilted on said base about an axis transversely to said direction.

5. A filter as in claim 1 having three transducers aligned in the direction of propagation, there being a central transducer and two outer transducers accordingly, the central or the outer transducers acting as transmitters for surface waves, the outer transducer or the central transducer acting as receiver for surface waves, the center-to-center spacings between the central transducer and each of the outer transducers being said center-to-center spacing, the long side of the parallelogram having length which is slightly longer than four times said center-to-center spacing.

6. In a filter circuit which includes a surface acoustic wave filter connected to an amplifier to establish a band pass amplifier system, the amplifier having a particular pulse response recovery time, the improvement for the acoustic wave filter, comprising:

a flat piezoelectric substrate carrying on one surface a plurality of interdigitized fingers establishing at least one transmitting transducer for surface waves and at least one transducer for receiving surface waves, the two transducers having a center-to-center spacing which is less than one half the distance an acoustic surface wave travels during said recovery time, the two transducers having an edge-to-edge distance in excess of the dimensions of the acoustic storage field of each said transducers, being about four wavelengths.

7. In a filter as in claim 6, said substrate having oblique edges transversely to a direction of propagation of said surface waves between said transducers, the surface of the substrate being covered with damping paddings adjacent the oblique edges for a length of at least about ten wavelengths.

8. In a filter circuit as in claim 6, there being a second filter similarly constructed as the first filter, the filters being bonded to a common support element and electrically cascaded, the support element having acoustic impedance closely matching the acoustic impedance of the substrates.

9. In a filter circuit as in claim 8, each of said filters having three transducers aligned in the direction of propagation, there being a central transducer and two outer transducers accordingly, the central or the outer transducers acting as transmitters for surface waves, the outer transducers or the central transducers acting as receiver for surface waves, the center-to-center spacings between the central transducer and each of the outer transducers being said center-to-center spacing, the long side of the parallelogram having length which is slightly longer than four times said center-to-center spacing.

10. A surface acoustic wave filter comprising:

a flat, piezoelectric substrate carrying on one surface a plurality of interdigitized metallization fingers for establishing plural transducers, at least one of the plural transducers for transmitting acoustic surface waves in a direction extending transversely to said fingers, thereby inherently producing bulk waves propagating into the interior of the substrate, at least one of the plural transducers for receiving said waves;

a support element having an acoustic impedance which is closely matched to the acoustic impedance of said piezoelectric substrate; and a bonding layer for bonding the substrate at its surface opposite said finger carrying surface to said support element, the bonding layer being electrically conductive and having a thickness being uniformly less than the wavelength of said surface and bulk waves.

11. A filter as in claim 10, wherein the substrate has the contour of a parallelogram, the spacing between the center of one of the transducers and the closest short side edge on one side of the one transducer being slightly larger than the center-to-center spacing of the one transducer and the respective next one on the other side of the one transducer.

12. A filter as in claim 10, said substrate having a tilted position with respect to said support element, with a tilt axis extending transversely to a direction of propagation of the surface waves.

* * * * *